United States Patent

Traweek

[15] 3,676,745

[45] July 11, 1972

[54] ELECTRONIC ASSEMBLY UTILIZING THERMAL PANEL FOR HEAT SINK

[72] Inventor: John C. Traweek, 9 Kensington Drive, Deerfield, Ill. 60015

[22] Filed: Sept. 4, 1970

[21] Appl. No.: 69,691

[52] U.S. Cl. ....................................317/100, 174/16 R

[51] Int. Cl. ....................................H02b 1/04, H05k 7/20

[58] Field of Search ......174/16 R, 52 PE; 317/100, 101 CW, 317/101 CC, 234 A

[56] References Cited

UNITED STATES PATENTS 3,518,493 6/1970 Bathrick ..............................317/100

3,201,655 8/1965 Bradt ..............................174/52.6 X

FOREIGN PATENTS OR APPLICATIONS 1,201,435 6/1964 Germany ..............................317/100

*Primary Examiner*—Lewis H. Myers

*Assistant Examiner*—Gerald P. Tolin

*Attorney*—Stone, Zummer & Aubel

[57] ABSTRACT

An improved heat sink for dissipation of heat in an electronic assembly is provided. The assembly includes a printed circuit oard on which components including various heat developing components are mounted. The heat developing components are contained or encapsulated in respective blocks which are positioned to dissipate heat to an associated mounting panel.

1 Claim, 5 Drawing Figures

Inventor:
John C. Traweek
By: Stone, Zummer, Livingston & Aubel
Att'ys.

ELECTRONIC ASSEMBLY UTILIZING THERMAL PANEL FOR HEAT SINK

The present invention relates to a heat sink for electronic components and circuitry. As is known in the art, it is frequently necessary to maintain the temperature of electronic components below a rated level. For this purpose, means may be provided for circulating cooling air about the components, or in other instances, the components are maintained in a cool or refrigerated environment; and in still other instances, the electronic components are maintained below a selected temperature level by physically connecting or attaching the components to relative large metallic surfaces to thereby absorb the heat from the electronic components and thence dissipate the heat to the surrounding environment. The present invention relates to this latter means of dissipating the heat developed in electronic circuitry to a heat sink, that is, by utilizing the principle of thermal conduction.

Accordingly, it is a principal object of the present invention to provide an improved heat sink for an electronic component assembly.

It is another object of the present invention to provide a heat sink which provides improved heat dissipation and also simplifies the assembly of the components in the associated circuit.

It is still another object of the present invention to provide an improved heat sink which enables economical construction.

The foregoing and other features and advantages of the invention will be apparent from the following more particular description of preferred embodiments of the invention, as illustrated in the accompanying drawings wherein.

Figure 1:
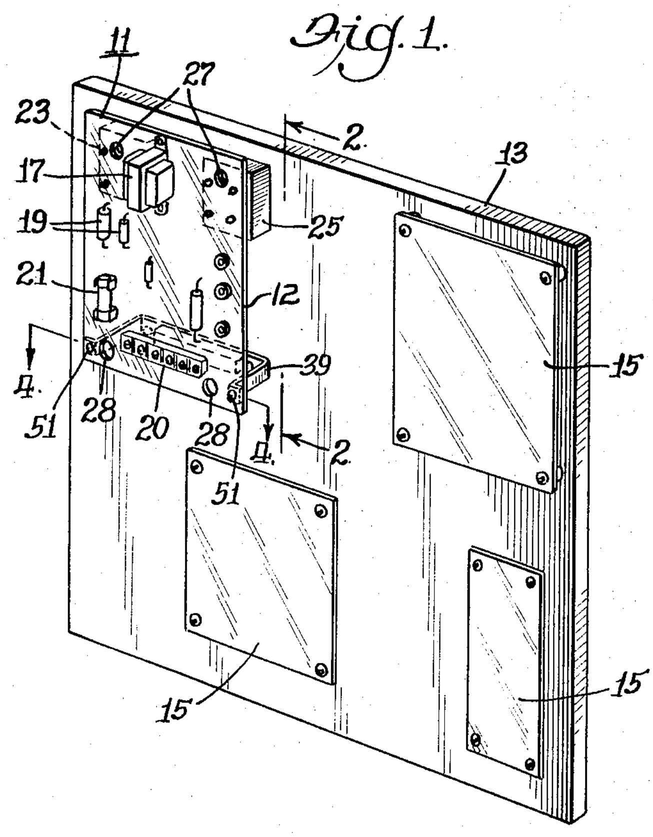
FIG. 1 is a perspective drawing showing the inventive assembly mounted on an associated panel.

Referring to FIG. 1, the inventive assembly 11 is shown connected to a metallic panel 13 forming a part of the over-all motor control system. The inventive assembly 11 depicted is utilized to control and adjust the speed of an associated motor; and accordingly, the assembly is preferably mounted on a motor subpanel convenient to the motor. Other boards or parts generally labeled 15 may also be mounted on panel 13.

The assembly 11 includes a printed circuit board 12 having various electronic components such as resistors 19, fuse 21, transformer 17, etc., mounted on the front side of the board 12. A printed circuit 49 is etched on the other or back side of the board 12; see FIG. 5. A terminal strip 20 is mounted on the front side of the board 12 and the electrical wiring is connected thereto.

Figures 3, 4, 5:
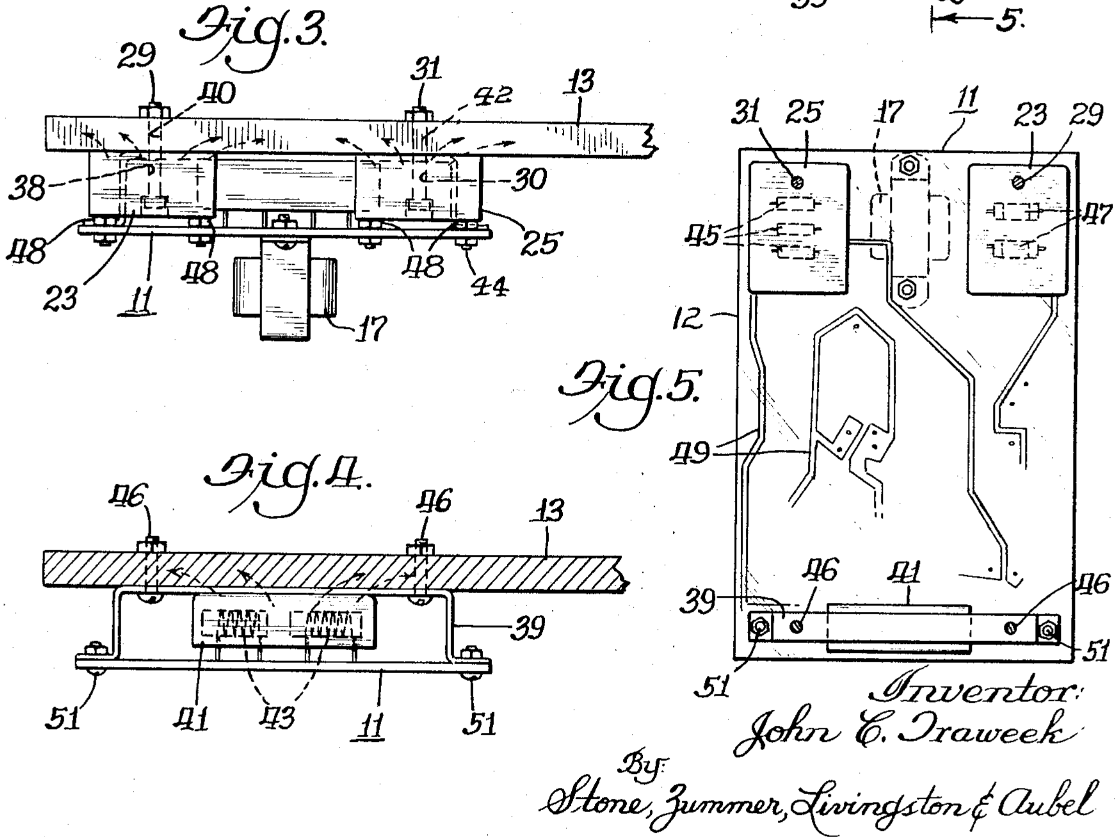
FIG. 3 is a section of the top view of the assembly mounting.
FIG. 4 is a top view partly in section taken along lines 4—4 of FIG. 1.
FIG. 5 is a back view of the inventive assembly.

A principal source of the heat developed by the assembly includes diodes generally labeled 45 which are encapsulated in block 25, (see FIG. 5); silicon controlled rectifiers generally labeled 47 and encapsulated in another block 23; and, the resistors generally labelled 43 and enclosed in resistor unit 41 (see also FIG. 4).

The block 23 formed in rectangular box shape is made of electrically insulating but thermally conductive material, and has two silicon controlled rectifiers 47 potted or encapsulated therein. The second block 25 is similar to block 23 and has three diodes encapsulated therein.

The blocks 23 and 25 are affixed to the board 12 by bolts and nuts generally labeled 44. Washer nuts 48 positioned on bolts 44 between board 12 and blocks 23 and 25 provide electrical connections between the components in the blocks 23 and 25 and selected portions of the printed circuit 49 on board 12. To provide positive, tight connections lock washers may be placed on bolts 44 adjacent to nuts 48. Note that nuts 48 also space board 12 from blocks 23 and 25, which tends to minimize the transfer of heat from the blocks to the board.

The blocks 23 and 25 are mounted on panel 13 by bolts 29 and 31 which pass through holes generally labeled 27 in the circuit board. The bolts 29 and 31 pass through respective countersunk holes 38 and 30 of blocks 23 and 25 and through holes 40 and 42 in board 12 to mount the blocks 23 and 25 securely to the panel 13. In addition to mounting the blocks 23 and 25 to panel 13, the bolts 29 and 31 also provide heat conduction paths to the panel 13.

Figure 2:
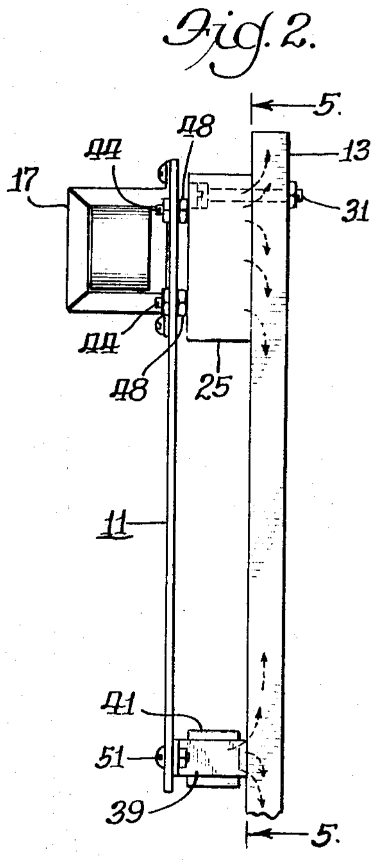
FIG. 2 is a side view taken along the lines 2—2 of FIG. 1.

The blocks 23 and 25 are rectangular in shape and have relatively large flat front and back surfaces. The flat back surface of the blocks 23 and 25 is positioned to abut against the panel 13. Thus, the relatively large flat surfaces of the blocks 23 and 25 provide good thermal flow paths for the heat developed by the components encapsulated in blocks 23 and 25, as is indicated by the upper group of arrows in FIG. 2.

FIG. 4 shows, in more detail, the resistor unit 41 which is mounted on a U-shaped metal bracket 39. Bracket 39 has the end of its leg portions attached to the board 12 by suitable nuts and bolts 51, and its flat, elongated bight portion attached to the metal panel 13 by suitable nuts and bolts 46. The resistor unit 41 comprises two resistors 43 contained in a block having a metallic cover which is affixed to the bight portion of bracket 39 as by spot welding. The relatively flat bight portion of the bracket 39 is affixed to bear against the panel 13. When the bracket is affixed to the panel 41, the heat developed by current flowing through the resistors 43 is dissipated or tends to flow as indicated by the arrows toward the metal panel 13.

A basic concept of the invention is the provision of a heat sink assembly including blocks having components positioned on, or in the blocks, with the blocks being mounted to make electrical connection to a circuit board, and with the blocks being mounted onto a panel which dissipates heat.

While only a preferred embodiment of the invention has been specifically disclosed, it will be apparent that other variations may be made thereto, all within the scope of the present invention as defined in the following claims. For example, the blocks 23 and 25 might be formed of metal such as aluminum and the components mounted thereon. As is known where the blocks are of aluminum, the proper electrical insulation has to be provided between the various parts of the assembly. Also, of course, the particular configuration or shape of the blocks 23 and 25 may be changed depending on the particular requirements.

I claim:

1. An assembly for electronic components utilizing thermal dissipating means as a heat sink comprising, in combination, printed circuit board means, thermally conductive blocks containing heat generating electronic components, bolt and washer means electrically connecting said components to said board means, said bolt and washer means physically affixing said blocks to said board means and said washer means being interposed between the blocks and said board means to minimize the transfer of heat from said blocks to said board means, a thermal dissipating panel providing a heat sink, and said blocks positioned to abut said panel to maximize the transfer of heat from said block to said panel.

* * * * *